US007827671B2

(12) United States Patent
Hakansson

(10) Patent No.: US 7,827,671 B2
(45) Date of Patent: Nov. 9, 2010

(54) METHOD FOR THE MANUFACTURING OF BALANCED TRANSDUCERS

(75) Inventor: Bo E. V. Hakansson, Göteborg (SE)

(73) Assignee: Osseofon AB, Gothenburg (SE)

( * ) Notice: Subject to any disclaimer, the term of this patent is extended or adjusted under 35 U.S.C. 154(b) by 45 days.

(21) Appl. No.: 12/240,197

(22) Filed: Sep. 29, 2008

(65) Prior Publication Data

US 2009/0064484 A1 Mar. 12, 2009

Related U.S. Application Data

(63) Continuation of application No. PCT/SE2007/000341, filed on Apr. 11, 2007.

(30) Foreign Application Priority Data

Apr. 12, 2006 (SE) .................................. 0600843

(51) Int. Cl.
*G01R 3/00* (2006.01)

(52) U.S. Cl. .......................... 29/595; 29/602.1; 29/606; 310/328; 310/371; 381/308; 381/326; 381/407; 381/417; 381/420; 600/25; 607/55; 607/56; 607/57

(58) Field of Classification Search ................ 29/592.1, 29/595, 602.1, 606; 310/328, 371; 381/308, 381/326, 407, 417–420; 600/25; 607/55–57; 623/10
See application file for complete search history.

(56) References Cited

U.S. PATENT DOCUMENTS 3,324,253 A * 6/1967 Uemura et al. .............. 381/189
6,751,334 B2 * 6/2004 Hakansson .................. 381/396
6,903,474 B2 * 6/2005 An .............................. 310/81
2005/0135651 A1 6/2005 Hakansson

FOREIGN PATENT DOCUMENTS

WO 0167813 9/2001
WO 03096744 11/2003

* cited by examiner

*Primary Examiner*—Paul D Kim
(74) *Attorney, Agent, or Firm*—Gauthier & Connors LLP

(57) ABSTRACT

The present invention is intended as a method for producing an electromagnetic transducer of variable reluctance type, where the transducer's seismic mass side and load side are mounted together in a first step while the inner and/or outer air gaps are supplied with shims in order to create balanced air gaps in an axial direction between the bobbin core's arms and the inner and outer yokes, whereupon in a second step the bobbin core is fixed through the side piece to an adapter already attached in a corresponding free moving end of a spring suspension, with compliant properties working in an axial direction and arranged between the seismic mass side and the load side in resting state in order to maintain balanced air gaps when finally, in a third step, the shims are removed and the air gaps are released.

10 Claims, 4 Drawing Sheets

METHOD FOR THE MANUFACTURING OF BALANCED TRANSDUCERS

PRIORITY INFORMATION

Figure 1:
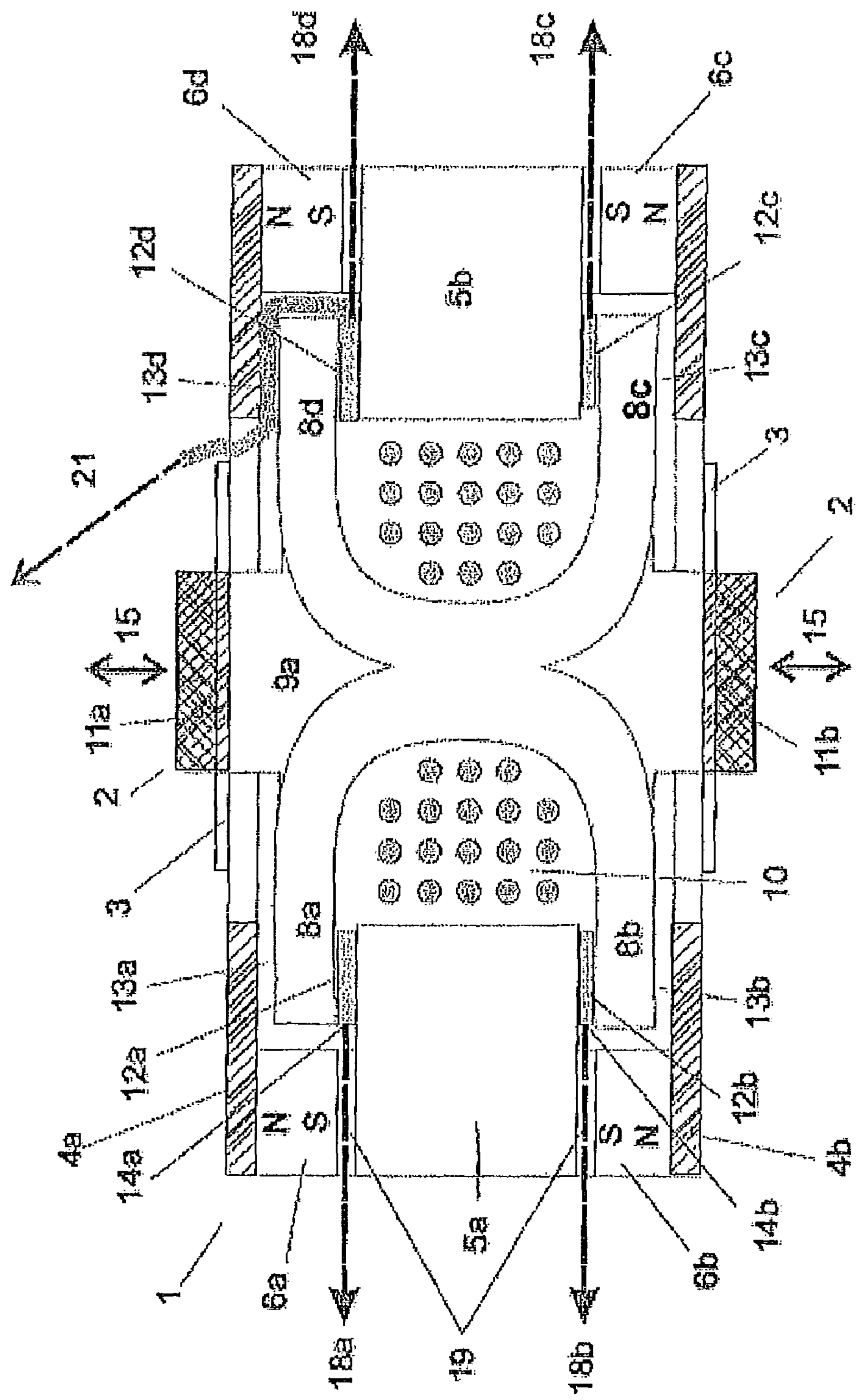

The present application is a continuation of International Application No. PCT/SE2007/000341 filed Apr. 11, 2007 which claims priority to Swedish Application No. 0600843-7 filed on Apr. 12, 2006, which are incorporated herein by reference in their entireties.

TECHNICAL SECTION

The present invention is intended as a method to create stable air gaps in the manufacturing of transducers with balanced air gaps such as in the manufacturing of the Balanced Electromagnetic Separation Transducer (BEST™).

BACKGROUND TO THE INVENTION

Electromagnetic transducers of variable reluctance type are used in many applications for stimulation through bone conduction such as in hearing aids, transducers for hearing diagnostic purposes and in communication systems.

In the manufacturing of all types of electromagnetic transducers of variable reluctance type it is of utmost importance that air gaps are small and stable. These should be small in order to maintain a maximum efficiency level and stable so as not to change over time or with differences in temperature/moisture or external mechanical influence. Air gaps are needed between one or more magnetically conductive components in the magnetic circuit of the seismic mass side (the reaction side) and one or more magnetically conductive components in the magnetic circuit of the transducer's load side (actuation side). By using a spring suspension arrangement between the seismic mass side and the load side these can be kept apart across the distance of the air gap-s. Manufacturing transducers with small and mechanically stable air gaps sets higher demands on the tolerances of components used and often requires that a fully assembled transducer is dismantled for readjustment of the air gaps. This can be achieved by, for example, grinding the surface facing the air gaps. Readjustment to the air gaps is the reason why manufacturing costs of these transducers are relatively high compared with transducers of the moving coil type.

Electromagnetic transducers of variable reluctance type have been improved through various inventions such as the U.S. Pat. No. 6,751,334, which describes a transducer according to a new principle, the BEST™ technique and through another SE-C-522,164 invention which describes how iron loss (eddy current loss) can be reduced by lamination. One specific property of these transducers is that they have so called "balanced air gaps".

SATE OF ART

Readjustments of the transducer's air gaps require that these can be dismantled easily. In conventional transducers of variable reluctance type this is achieved through a screw attachment, that stabilises the spring suspension which maintains the air gaps, such is the case in US 2005/254,672, US 2006/0,045,298 A1 and U.S. Pat. No. 6,141,427 for example.

This method using screw attachment has been considered in the manufacturing of BEST™ transducers but as these have several concurrent air gaps, several readjustments are required which becomes very costly. The method which uses a screw attachment is also unable to provide the general precision in dimensions which is required in this type of transducers.

An entirely different method for maintaining stable air gaps has been tested where a compliant material is placed in the air gaps as is described in U.S. Pat. No. 6,751,334, US 2006/0,045,298 A1, U.S. Pat. No. 6,985,599 and SE 514,929, for example. The drawback with this method is that the compliant material deteriorates and deforms over time influencing the transducer's frequency properties which is a great inconvenience. In the U.S. Pat. No. 6,985,599 the compliant material is therefore combined with repelling magnets mounted to respective sides of the air gaps which seem to be both a complicated and costly method.

Another method was considered where the permanent magnets in a fully assembled transducer were individually magnetised but this technique was also judged to be too complicated.

SUMMARY OF THE INVENTION

The present invention describes a new method, in three steps, to achieve small, stable and balanced air gaps in the manufacturing of transducers with balanced air gaps such as in the manufacturing of the BEST™ transducers. This method can be used at a low cost and do not require any readjustments.

This invention is intended especially as a method for manufacturing electromagnetic transducers of the variable reluctance type. The method is characterised by in the first step fixing the transducer's seismic mass side and load side together while the existing air gaps between are provided with shims for achieving balanced air gaps in an axial direction. In the second step the load side is firmly attached to the seismic mass side by fastening them to the corresponding free moving ends of a spring suspension with compliant properties working in an axial direction and arranged between the seismic mass side and the load side in its resting state in order to maintain balanced air gaps. The shims are finally removed in the third step and the air gaps are released.

A preferred embodiment of the invention is characterised by that both the seismic mass side and the load side are attached to their respective ends of the spring suspension which is at resting state after the air gaps have been provided with shims and where the spring suspension consists of a flat spring where an outer yoke as well as adapters have been preassembled.

Another preferred embodiment of the invention is characterised by that the shims being dismantled after that the yoke has been attached to the spring suspension. The shims are drawn out along the air gaps' length- or side directions.

Another preferred embodiment of the invention is characterised by that the two side pieces of the inner yoke which extends in an axial direction, one on each side and close to the end surfaces of the adapters, which are attached to the central part of the spring suspension whose other end is attached to the outer yoke, are attached firmly to the adapter's end surfaces when the spring suspension is at resting state and the air gaps are balance by use of shims. Such firm attachment can be done with spot welding, laser welding or by use of glue joint.

Another preferred embodiment of the invention is characterised by the seismic mass side and the load side being attached to respective ends of a spring suspension, which has appropriate compliant properties working in the axial direction and which is arranged between the inner and outer yoke in resting state in order to maintain balanced air gaps when the shims are finally removed, and where the attachment is done by means of protruding pins/axles, that are rigidly attached to the corresponding holes in the adapters by means of a space filling and tolerance absorbing glue joint or by deformation/upsetting or welding.

Another preferred embodiment of the invention is characterised by attachment of the load side to the corresponding free moving ends of a spring suspension, which has appropriate compliant properties working in the axial direction and which is arranged between the inner and outer yoke in resting state in order to maintain balanced air gaps when the shims are finally removed, and where the attachment is made by means of a slot filling and tolerance absorbing glue joint positioned lengthwise between extended parts of the adapters and the groove part of the bobbin core.

Another preferred embodiment of the invention is characterised by the shims being made of metal.

Another preferred embodiment of the invention is characterised by the shims being made of polymer material.

Another preferred embodiment of the invention is characterised by the shims being made of composite material.

Another preferred embodiment of the invention is characterised by the inner and outer air gaps having different lengths.

Another preferred embodiment of the invention is characterised by the shims surrounding the inner yoke's respective arm and dismantled by being drawn inward toward the central axle portion of the transducer.

In the first step—Step 1—the air gaps, when these are in balance, are provided with a space filling rigid material such as plastic shims or a metal material of appropriate thickness while the spring suspension is in resting state and attached (permanently fastened and rigidly attached) to the seismic mass side (or load side). In the next step—Step 2—the spring is then attached by its other and free end, the seismic mass side (or load side) through for example spot welding, laser welding or gluing. In the third step—Step 3—the shims are removed so that the air gaps are released and the transducer is ready for use without need for readjustments.

DETAILED DESCRIPTION

Definitions

By "balanced air gaps" is meant that the air gaps in the magnetic circuit/circuits have a proper length such that the static magnetic forces between the seismic mass side and the load side are essentially balanced.

By "air gaps" in the manufacturing of variable reluctance transducers is meant that the air gaps are in the range of approximately 40-400 μm.

By "appropriate compliant properties" is meant that the resulting dominant resonance frequency in the transducer's transmission characteristic, which depends among other things upon the spring constant and damping, have a shape and location which is appropriate for the application in use.

BRIEF DESCRIPTION OF THE DRAWING FIGURES

FIG. 1: Shows Step 1 in a first example of embodiment where all components are mounted including the shims which assure that the air gaps are in a balanced state during the manufacturing process.

Figure 2:
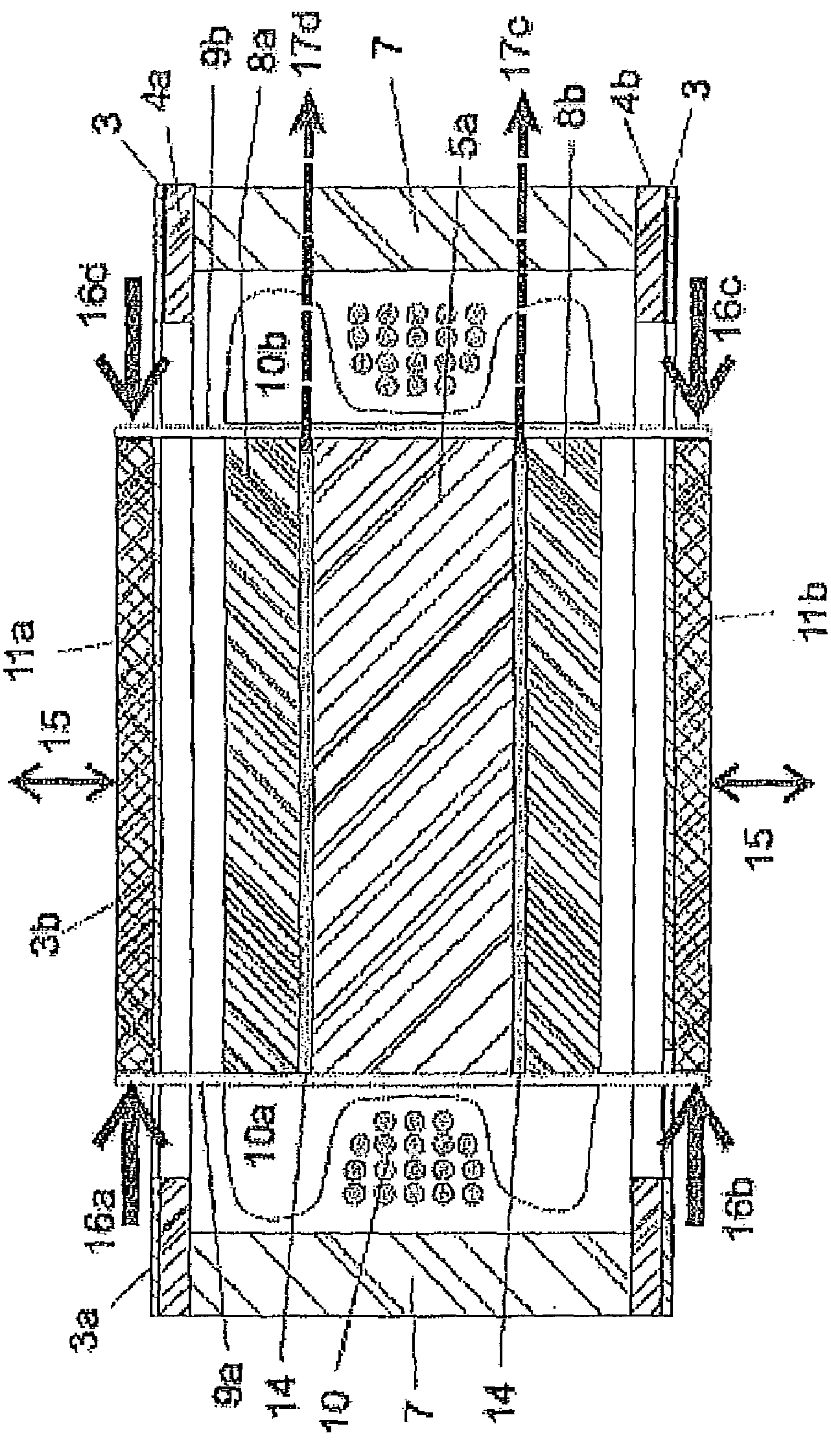

FIG. 2: Shows Step 2 in a first example of embodiment where the unstressed spring suspension is in resting state when its free ends are rigidly attached to the side piece of the bobbin core.

Figure 3:
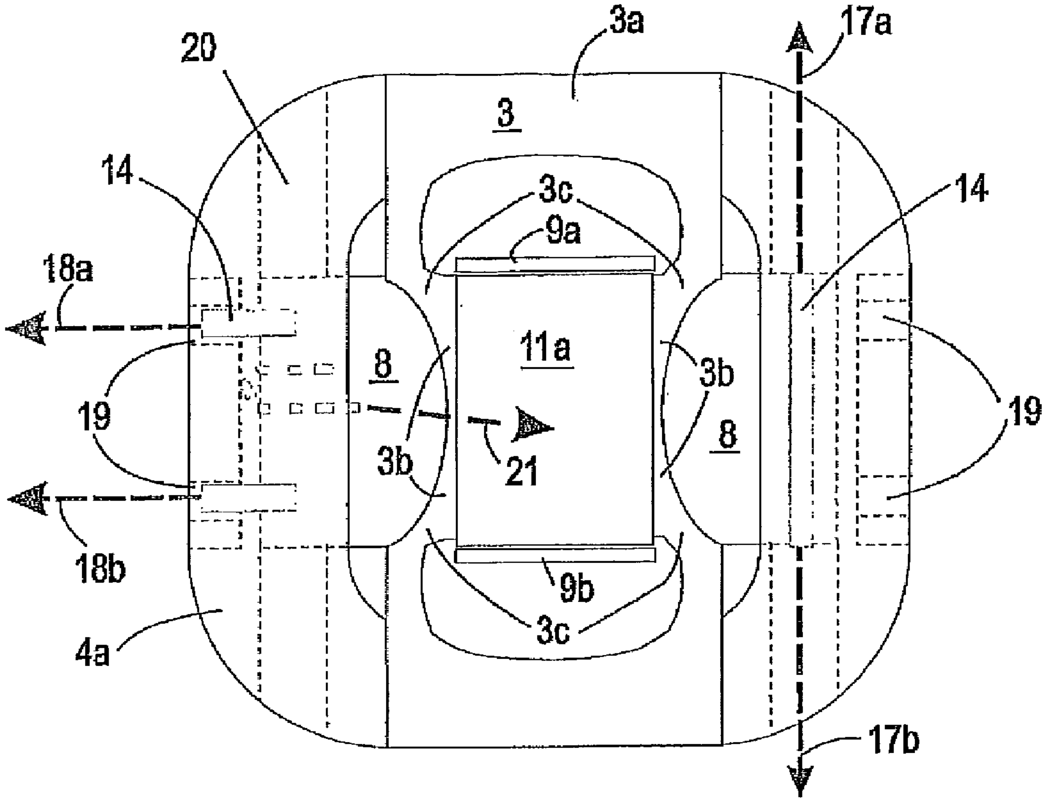

FIG. 3: Shows Step 3 where the shims can be dismantled in three different ways once the spring suspension has been fixed. Two of the methods are also shown in FIG. 1 and the third in FIG. 2.

Figure 4:
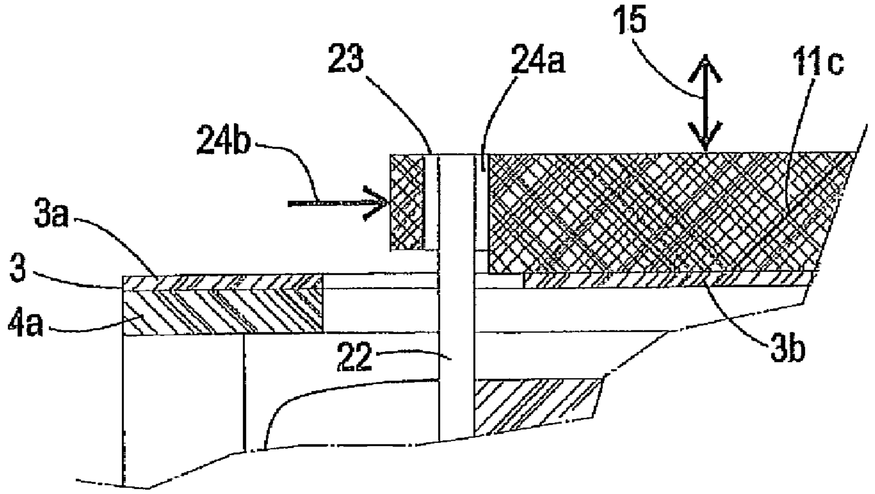

FIG. 4: Shows alternate methods of fixing the spring suspension by gluing or upsetting of the axel which is fastened to the bobbin core.

Figure 5:
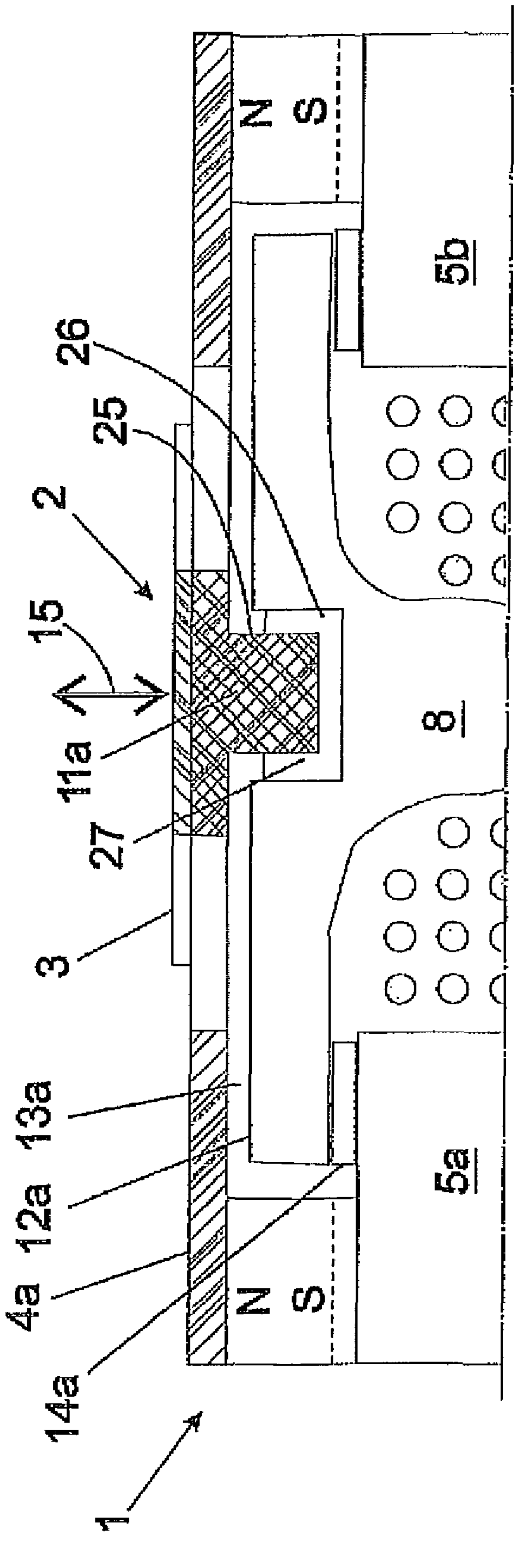

FIG. 5: Shows a third method of fixing the spring suspension through an inwardly extended adapter and a glue tub directly to the bobbin core.

FIG. 1 shows a cross section of a fully assembled BEST™ transducer with shims in place to ensure balanced air gaps and before the spring suspension is attached. For a more detailed description of BEST™ transducers' functional principles refer to U.S. Pat. No. 6,751,334 and Håkansson, J. Acoust. Soc. Am. 113 (2), February 2003, *The balanced electromagnetic separation transducer: A new bone conduction transducer.*

The transducer consists essentially of a seismic mass side 1 (reaction side) and a load side 2 (actuation side) as well as a spring suspension in between and which is made up of two parallel blades springs 3 on each side of the bobbin. The blade springs can be provided with a damping function by means of lamination with a damping coating layer and a counter acting blade spring, this is done in a way which is already known and not shown in FIG. 1. The connection between the load side and the load is also not shown in FIG. 1 as for example in the case of a house where the transducer is encapsulated or a titanium screw which is anchored in the cranium of people with certain kinds of hearing impairments, which are permanently connected to the central, rigid, middle part of the load side 2 of the transducer on the one, the other or both sides.

The seismic mass side 1 consists of two outer yokes 4*a, b*, two inner yokes 5*a, b* as well as four magnets 6*a, b, c, d*. Usually there is even an outer seismic mass 7 (shown only in FIG. 2) in order to increase the mass on the seismic mass side 1 and in this way obtain an appropriate resonance frequency.

The load side 1 consists of a bobbin core 8 which has four arms 8*a, b, c, d*, and two side pieces 9*a, b* and a coil 10. In order to ensure electrical insulation between the coil wires and the bobbin core 8 a coil holder 10*a, b* with suitable insulation can be used.

The outer part 3*a* of the spring suspension 3 is permanently attached to the outer yoke 4*a, b* by means of spot welding, laser welding or gluing and a similarly attached adapter 11*a, b* mounted in the same way to a middle part 3*b*, see FIG. 2. The spring suspension 3 is made in such a way that compliance takes place primarily in the arms 3*c* (FIG. 3) where the outer part 3*a* successively grows into the inner part 3*b*. The adapters 11*a* and 11*b* can be made differently in order to fit with peripheral/external connections but their length is the same and made in such a way that the bobbin core's side piece 9*a, b* can just slip by.

Four inner air gaps 12*a,b,c,d* are formed between the inner yokes 5*a, b* and the bobbin core arms 8*a,b,c,d* and four outer air gaps 13*a,b,c,d* are formed between the outer yokes 4*a, b* and the bobbin core's arms 8*a, b, c, d*. Four shims (spacers) 14*a, b, c, d* are placed at least in the inner air gaps 12*a, b, c, d*. The shims 14 can consist of thin metal or plastic or film such as silicon polymer/Kevlar/Teflon/Krypton or of the like where the thickness is adapted to maintain an adequate length of the air gaps. In applications where the output levels (deflections) are high the length of the air gaps can reach an order of magnitude 400 μm. The length of the air gaps can decrease to an order of magnitude 40 μm in applications where high efficiency and low power consumption are important. It can be advantageous to have shims 14 also in some or all of the outer air gaps 13*a, b, c, d* but if the tolerances of ingoing components are sufficiently good this is not needed. It should also be pointed out that the lengths of the inner and outer air gaps need not be the same in order to maintain balanced air gaps. The purpose with the shims is to form fixed air gaps between the seismic mass side 1 and the load side 2 so that the static forces from the magnets 6 balance out while the spring suspension 3 is in resting state. The adapters 11*a, b* are attached to the spring suspension's middle part 3*b* through spot welding, laser welding or gluing, for example. The arrows 15 in FIG. 2, moving in an axial direction, indicate that the adapters can move freely in relation to the side pieces 9*a, b* before final fixation.

When the transducer is in this balanced state the side pieces 9 are rigidly attached to the adapters 11*a, b* with the help of a laser or spot welder as is indicated by arrows 16*a, b, c, d* in FIG. 2. The seam between the side pieces 9*a, b* and the adapter 11*a, b* can alternatively be fixed to each other by using strong glue.

When the fixation between the side pieces 9 and the adapters 11*a, b* is completed the shims 14 are taken away which is shown in FIGS. 1-3. This can be done by drawing the shims 14 along the length of the air gaps which is indicated by arrows 17*a, b* or in the direction of the sides 18*a, b*. Withdrawal of the shims in some directions may require that there are one or more passages 19 and 20 in some of the components. It is also possible to draw flexible shims of suitable width like 21 placed in the air gap surrounding the bobbin core's arms 8*a, b, c, d*. The shims 14 are only shown in some air gaps in FIG. 3 in order to illustrate alternative possibilities of dismantling.

An alternative method for rigidly attaching the side pieces 9 to the adapter 11*c* is shown in FIG. 4 where the bobbin has laterally attached axels 22 instead of the side piece. It can be advantageous to integrate the axels 22 with the coil holders 10*a, b*. The adapter in this example of embodiment has an extended length in which a hole 23 has been drilled with a somewhat larger diameter than that of the axel. Affixing is later done with glue 24*a* or with a deformation force applied in the direction indicated by the arrows 24*b*. Affixing could also been done by welding the axel 22 to the adapter 11*c* (not shown).

Another method that can be used for stress free fixation of the spring suspension's middle part to the bobbin core is shown in FIG. 5. The adapter 11*d* has here been placed on the inside of the spring suspension and having an inwardly extending ridge 25 which fits with in a groove 26 in the bobbin core 8 with some space in between. At this point glue 27 can easily be applied filling the space, this glue later hardens, and rigid attachment to the spring suspension in its resting state is then achieved.

It is also possible to glue the spring suspension at both ends at the same time, the outer end 3*a* to the seismic mass side 1 and the inner end 3*c* to the bobbin core through the adapters.

Balanced transducers of variable reluctance type can even be made without separating the static and the dynamic magnetic flow as in the BEST™ technology. It should also be pointed out that it is obvious to any layman that the present invention is applicable even for other embodiments of balanced variable reluctance transducers as for example US 2006/0,045,298 A1, U.S. Pat. No. 6,985,599 and SE 514,929 and in applications where corresponding balanced constructions are used in the other direction i.e. for mechanical to electrical transformation like in microphones.

It is evident through the examples of embodiment described, each one and in combination, that there are many different possibilities to first apply the shims and later permanently attach the seismic mass side to the load side through the spring suspension and thereafter finally remove the shims.

Although these examples of embodiment are presented to describe the invention it is clear that a professional could modify, add and take away details without deviating from the invention's scope and spirit as is defined by the following patent claim.

REFERENCE NOTES

1 Seismic mass side
2 Load side
3 spring suspension
4 Outer yoke
5 Inner yoke
6 Magnets
7 Seismic mass
8 Bobbin core
9 Side piece
10 Coil
11 Adapter
12 Inner air gap
13 Outer air gap
14 Shims
15 Directional arrows
16 Spot/laser welding direction
17 Arrows indicating withdrawal of the shims along the lengths of the air gaps
18 Arrows indicating withdrawal of the shims along the sides of the air gaps
19 Passages in the magnets
20 Slots/grooves in the seismic mass
21 Film in the air gap
22 Axle
23 Hole in the adapter
24 Glue joint
25 Extended part of the adapter
26 Groove in bobbin core
27 Glue joint in the groove

The invention claimed is:

1. A method for creating balanced inner and/or outer air gaps during the manufacture of electromagnetic transducers of variable reluctance type, said method comprising the following steps—fixing the transducer's seismic mass side and load side to each other by temporarily fitting inner and/or outer air gaps there between with shims to provide balanced inner and/or outer air gaps in an axial direction between arms on a bobbin's core and an inner and outer yoke; and—attaching the seismic mass side to the load side through a spring suspension, said spring suspension having compliant properties working in the axial direction, and being in its resting state while arranged between the seismic mass side and the load side in order to maintain the inner and/or outer air gaps balanced; and finally—the shims are removed from the balanced inner and/or outer air gaps.

2. The method according to claim 1, wherein either the seismic mass side or the load side already is attached to one end of the spring suspension, and after the inner and/or outer air gaps have been fitted with the shims, an adapter on a remaining free moving end of the spring suspension is attached to the remaining side of the seismic mass or load.

3. The method according to claim 2, wherein the shims are dismantled by pulling them along the length of the balanced inner and/or outer air gap, or in a sidewise or inwards radial direction.

4. The method according to claim 3, wherein the two side pieces, one on each side of the bobbin's core are attached to surface ends of the adapter by spot welding, laser welding or gluing when the spring suspension is in the resting state and the inner and/or outer air gaps are balanced by means of the shims.

5. The method according to claim 3, wherein the seismic mass side and load side are attached to the corresponding free moving ends of the spring suspension, by means of an axle attached to the bobbin's core, said axle having two ends, both of which are arranged and attached in corresponding holes in the adapters by a space filing and tolerance absorbing glue joint or deforming impact in a radial direction or by welding.

6. The method according to claim 3, wherein the seismic mass side and load side are attached to the adaptors at corresponding free moving ends of the spring suspension, by means of a space filling and tolerance absorbing glue joint between an extended part of the adapters and a groove in the bobbin's core.

7. The method according to claim 1, wherein the shims are made of metal.

8. The method according to claim 1, wherein in the shims are made of polymer material.

9. The method according to claim 1, wherein the shims are made of composite material.

10. The method according to the claim 1, wherein the shims cover the inner yoke's respective arm and are dismantled through an inward pulling toward the axle centre.

* * * * *